United States Patent [19]

Shibata

[11] Patent Number: 4,543,597
[45] Date of Patent: Sep. 24, 1985

[54] DYNAMIC SEMICONDUCTOR MEMORY AND MANUFACTURING METHOD THEREOF

[75] Inventor: Tadashi Shibata, Yokohama, Japan

[73] Assignee: Tokyo Shibaura Denki Kabushiki Kaisha, Kawasaki, Japan

[21] Appl. No.: 506,593

[22] Filed: Jun. 22, 1983

[30] Foreign Application Priority Data

Jun. 30, 1982 [JP] Japan .................................. 57-112970
Dec. 28, 1982 [JP] Japan .................................. 57-227402
Dec. 28, 1982 [JP] Japan .................................. 57-227429

[51] Int. Cl.$^4$ ...................... H01L 29/78; H01L 29/04
[52] U.S. Cl. .................................. 357/23.6; 357/23.13;
357/59; 156/643
[58] Field of Search ............... 357/23.6 P, 23 C, 41,
357/59, 51, 84; 156/643; 204/192 E; 148/DIG.
131; 29/577 C

[56] References Cited

U.S. PATENT DOCUMENTS

| | | | |
|---|---|---|---|
| 3,413,497 | 11/1968 | Atalla | 357/23.6 P |
| 3,512,058 | 5/1970 | Khajezadeh | 357/23.6 P |
| 3,789,503 | 2/1974 | Nishida et al. | 357/41 |
| 3,999,212 | 12/1976 | Usuda | 357/23.6 P |
| 4,044,373 | 8/1977 | Nomiya et al. | 357/23.6 P |
| 4,067,099 | 1/1978 | Ito et al. | 156/643 E |
| 4,139,935 | 2/1979 | Bertin et al. | 357/23.6 P |
| 4,455,739 | 6/1984 | Hynecek | 29/571 |

FOREIGN PATENT DOCUMENTS

| | | | |
|---|---|---|---|
| 0101294 | 8/1978 | Japan | 357/23 C |
| 0165681 | 12/1980 | Japan | 357/59 |
| 56-966 | 7/1981 | Japan | 357/23.6 P |
| 0075463 | 5/1982 | Japan | 156/643 |

OTHER PUBLICATIONS

P. K. Chatterjee et al "A Survey of High-Density Dynamic RAM Cell Concepts", IEEE Trans. Electron Devices, vol. ED-26, 1979, pp. 827–838.
IBM Technical Disclosure Bulletin, vol. 13#10, p. 2847 by Enenidis, Mar. 1971.
IBM Technical Disclosure Bulletin, vol. 20 #11A, Apr. 1978, "FET Device Manufacturing Process" by Fortino et al.

Primary Examiner—Andrew J. James
Assistant Examiner—Mark Prenty
Attorney, Agent, or Firm—Oblon, Fisher, Spivak, McClelland & Maier

[57] ABSTRACT

A method to prevent dielectric breakdown of a thin gate insulating film of a memory cell capacitor of a dynamic semiconductor memory device such as a dynamic random access memory during fabrication of the memory. A diffusion layer of an n-conductivity type is formed on a predetermined surface region of a semiconductor substrate of a p-conductivity type so as to form a p-n junction. Then, there is formed a polycrystalline semiconductor layer which corresponds to a gate electrode and which is connected to the thin gate insulating film and partially contacts the diffusion layer. Thus the polycrystalline semiconductor layer is electrically connected to the substrate through a diode region which is formed of the p-n junction. The polycrystalline semiconductor layer is then etched in a reactive ion etching step, and any abnormal charges stored in the thin gate insulation layer during the reactive etching step are immediately discharged to the substrate.

24 Claims, 21 Drawing Figures

1

DYNAMIC SEMICONDUCTOR MEMORY AND MANUFACTURING METHOD THEREOF

BACKGROUND OF THE INVENTION

The present invention relates generally to a semiconductor memory device and, more particularly, to a semiconductor memory device with dynamic memory cells and a manufacturing method thereof.

A conventional dynamic random access memory having a plurality of dynamic memory cells each of which comprises a transistor element and a capacitor element has been widely used in the field of dynamic semiconductor memory devices. The dynamic memory cells have word lines and bit lines which are connected in a matrix form.

In general, the capacitor included in each of the memory cells comprises a MOS capacitor. In this case, the thickness of a gate insulating film of the capacitor is about 300 to 500 Å in a 64K-bit dynamic RAM (dRAM), about 200 Å in a 256K-bit dRAM, and about 100 Å or less in a 1M-bit dRAM. In a memory having such a thin insulating film, the frequency of film-isolation breakage is one of the most important factors in determining the yield of the device.

An insufficient breakdown voltage of the insulating film of the MOS capacitor may result from the fact that impurities are introduced during the process of forming the insulating film, or that the insulating film itself is defective. In addition to these reasons, electrostatic breakdown occurring during the manufacturing process is an important reason for an insufficient dielectric breakdown voltage. In particular, when reactive ion etching (RIE) using free charge carriers and sputtering etching are performed for micropatterning, electrostatic breakdown of the insulating film during the etching process is a very important factor in the above drawback. Furthermore, electrostatic breakdown may also occur from a noise component mixed in a power source line during the operation of the circuit. The above problem is serious and typically occurs when the gate insulating film is 100 to 200 Å or less.

SUMMARY OF THE INVENTION

It is an object of the present invention to provide a new and improved semiconductor memory device having good dielectric characteristics to properly prevent electrostatic dielectric breakdown of a thin insulating film of a capacitor of a memory cell, and a method for manufacturing the same.

According to the present invention, in order to form a memory cell capacitor, an electrical conductive layer such as a polycrystalline semiconductor layer, which corresponds to a gate electrode and which is connected to the thin insulating film formed on a semiconductive substrate, is connected to the substrate either through a p-n junction of the diode element or through a semiconductor layer formed in the surface layer of the substrate so as to have the same conductivity type as that of the substrate. Abnormal charges are discharged to the substrate so as to attain the object of the present invention. It should be noted that these abnormal charges include the charge of the conductive layer arising during the manufacturing process and/or the charge of the conductive layer arising from a surge voltage applied from an external source through the voltage source line.

BRIEF DESCRIPTION OF THE DRAWINGS

The present invention is best understood by reference to the accompanying drawings, in which.

DETAILED DESCRIPTION OF THE PREFERRED EMBODIMENTS

FIG. 1A to 1E are sectional views for explaining the major steps of manufacturing a dynamic RAM (dRAM) according to a first embodiment of the present invention. FIGS. 1A to 1E illustrate the steps for forming a plurality of memory cell capacitors in/on a semiconductor substrate 10. Switching transistor elements respectively included in the memory cells are manufactured in the same manner as in a conventional method, and a detailed description thereof will be omitted, since the formation of the switching transistor elements is not directly associated with the technical principle of the present invention.

Figure 1A:
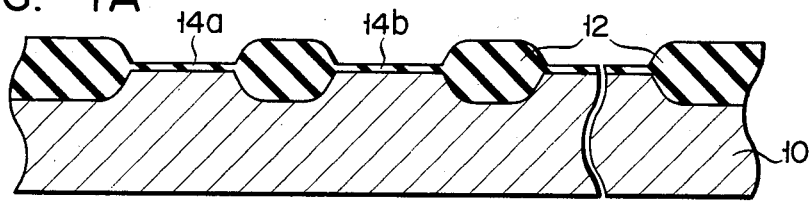
FIGS. 1A to 1E illustrate, in schematic cross-sections, some of the major steps in the formation of a dynamic RAM (dRAM) in accordance with a first embodiment of the present invention.

Referring to FIG. 1A, a reference numeral 10 denotes a silicon substrate 10 having one conductivity type, for example, p-type, in and on which field insulating layers 12 for element isolation are formed so as to provide prospective element formation regions. Thin gate insulating films 14a, 14b, . . . are formed among the layers 12 on the silicon substrate 10 so as to form capacitor elements one of which is included in each memory cell of the dRAM. Each of the gate insulating films 14a, 14b, . . . has a thickness of about 100 Å. Any type of electrically insulating film selected from a thermal oxide film, a thermal deposited nitride film and any combinations of these films may be used as the gate insulating films 14a, 14b, . . . .

Figure 1B:
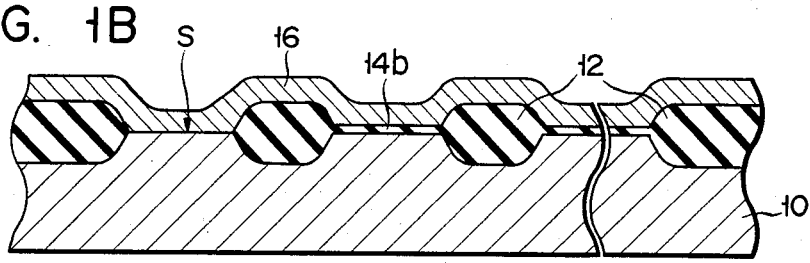
Figure 1C:
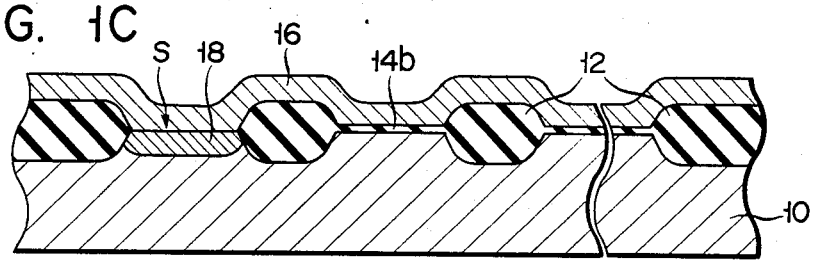

Referring to FIG. 1B, some of the gate insulating films 14a, 14b, . . . formed on the substrate 10 (e.g., the gate insulating film 14a) are removed. A photoresist pattern is formed by a known technique on the structure shown in FIG. 1A to etch away the gate insulating film 14a. A polycrystalline silicon layer 16 is deposited on the exposed portion of the substrate 10, the field insulating layers 12 and the gate insulating films 14b, . . . The polycrystalline silicon layer 16 serves as a gate electrode. The obtained structure is then placed in a POCl₃ atmosphere for diffusion. An n-type impurity such as phosphorus is diffused in the polycrystalline silicon layer 16. A sheet resistance of the phosphorus-doped polycrystalline silicon layer 16 is decreased to 20 to 50 $\Omega/\square$. An n+-type diffusion layer 18 is formed by phosphorus diffusion in a surface region S of the substrate 10 which corresponds to a region of the etched gate insulating film 14a, as shown in FIG. 1C. Therefore, a p-n junction is formed between the p-type silicon substrate 10 and the n+-type diffusion layer 18. In other words, the electrode layer 16 is connected to the silicon substrate 10 through an equivalent diode.

Figure 1D:
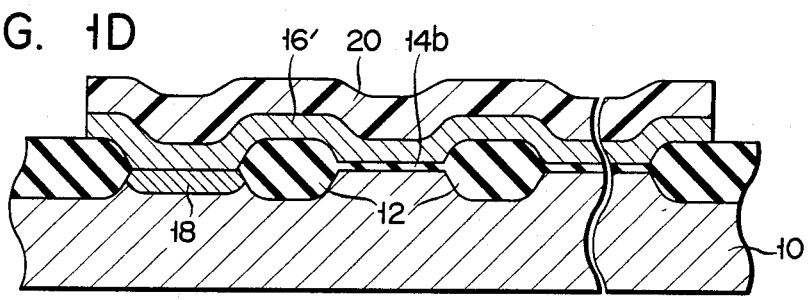
Figure 1E:
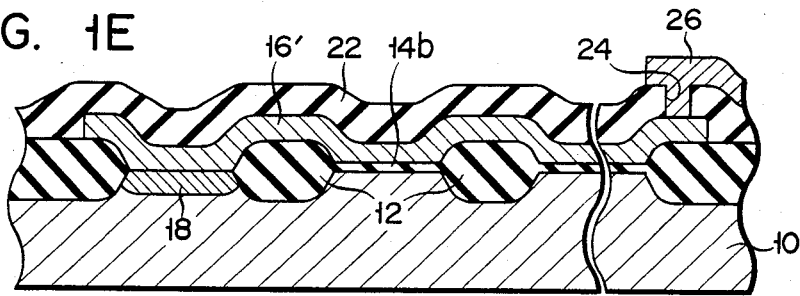

Referring to FIG. 1D, a photoresist film 20 is deposited on the polycrystalline silicon layer 16. The photoresist film 20 is photoetched by a known technique to have a desired mask pattern (not shown). The polycrystalline silicon layer 16 is then subjected to a known selective etching using the photoresist pattern. In this case, reactive ion etching (RIE) is utilized using a gas containing a Cl component such as Cl₂ or $C_xF_yCl_z$. After the photoresist pattern is removed, an insulating layer 22 having an opening corresponding to a contact hole 24 is formed on an etched polycrystalline silicon layer 16', as illustrated in FIG. 1E. Subsequently, a wiring pattern 26 of an electrically conductive material such as aluminum, aluminum based alloys or platinum is formed so as to be electrically connected with the polycrystalline silicon layer 16' through the contact hole 24 formed in the insulating layer 22. Capacitor elements thus obtained and transistor elements (not shown) constitute dynamic memory cells. It should be noted that one of a power source voltage $V_{DD}$ (e.g., 5 V) or a ground voltage $V_{SS}$ is applied to the Al wiring pattern 26.

Figure 2:
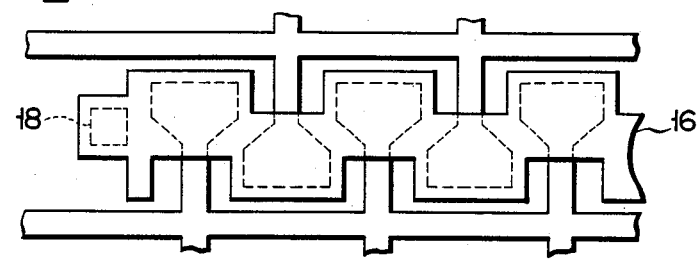
FIG. 2 is a partial plan view of the dRAM shown in FIG. 1.

FIG. 2 schematically shows the plan-view structure of the dynamic memory cell arrangement prepared in the manner described above. It is apparent from FIG. 2 that the polycrystalline silicon layer 16' is completely formed over the n+-type diffusion layer 18 in the surface region S of the silicon substrate 10. This is because overetching of the silicon substrate 10 is prevented with this structure when the layer 16' is etched by the RIE method.

According to the embodiment described above, the occurrence of electrostatic dielectric breakdown generated at the gate insulating layer 14 during the manufacturing process can be prevented for the following reason.

When the polycrystalline silicon layer 16 is etched to have the predetermined pattern, the ion components such as Cl+, Cl₂+, F+ and the like contained in the etchant are left in the layer 16. A high intensity of electric field is generated by the remaining ion components in the thin layer 16. However, when etching is completed and the polycrystalline silicon or gate electrode layer 16' is formed, the gate electrode layer 16' is electrically and completely insulated from the silicon substrate 10. As a result, the ion components left in the gate electrode 16' cannot be removed therefrom. In general, after etching is performed, 30% to 50% overetching may occur and the number of ion components left in the gate electrode 16' further increases to cause the intensity of the electric field in the thin insulating film 14 to be further increased. As a result, the gate insulating film 14 is subjected to electrostatic dielectric breakdown, and electrical insulation becomes incomplete. The ions in the gate electrode 16' tend to flow concentrically to a portion of the film 14 at which the dielectric breakdown voltage is relatively low. Therefore, the physical characteristics in this portion are greatly degraded, thereby degrading the yield of the memory devices.

On the other hand, according to the first embodiment of the present invention, as clearly illustrated in FIG. 1D, part of the gate electrode layer 16' comprising polycrystalline silicon is directly connected to the n+-type diffusion layer 18 formed in part of the p-type silicon substrate 10. In other words, the layer 16' is diode-connected to the silicon substrate 10. The diode connection between the layer 16' and the silicon substrate 10 results in forward bias for the abnormal ions (positive charge in the first embodiment) which are produced during the manufacturing process of the memory device and are stored in the layer 16'. Therefore, the abnormal ions are immediately discharged from the gate electrode layer 16' to the p-type silicon substrate 10 through the n+-type diffusion layer 18 as junction leakage current or junction breakdown current. Therefore, the electric field in the thin insulating film 14 does not increase abnormally, thereby preventing the film 14 from being damaging by electrostatic dielectric breakdown. The conventional problem is thus solved. As a result, the yield of memory devices such as a dRAM can be greatly improved.

In the first embodiment, the gate electrode layer 16' of polycrystalline silicon is connected to the n-type region of the p-n junction. If the gate electrode is negatively charged with respect to the silicon substrate 10, the p-n junction is forward biased, so that the charge is readily discharged to the silicon substrate 10. On the other hand, when the gate electrode is positively charged with respect to the silicon substrate 10, the p-n junction is reverse biased. However, a current of $10^{-12}$ to $10^{-13}$ A flows by a small reverse bias voltage, so that it is sufficient to discharge the charge generated during etching to the silicon substrate 10. It should be noted that, in order to further improve reliability of the etching process, the reverse voltage at the p-n junction must be set lower than that of the gate insulating film 14. For example, when a thermal oxide film of 100 Å thickness is used as the gate insulating film 14, the oxide film has a dielectric withstand voltage of about 10 V. The reverse withstand voltage at the p-n junction must be set to be a voltage (e.g., 8 V) of lower than 10 V. The dielectric withstand voltage characteristics described above can be achieved wherein the depth of the p-n junction decreases when the n+-type diffusion layer 18 is formed.

Figure 3:
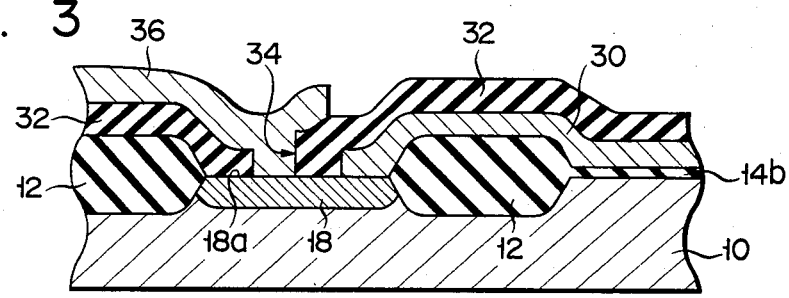
FIGS. 3 and 4 are respectively partial sectional views showing the main parts of dRAMs as modifications of the dRAM shown in FIG. 1.
Figure 4:
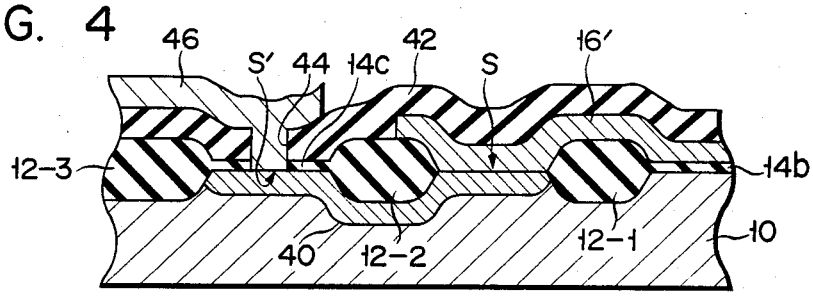

FIGS. 3 and 4 are partial sectional views showing n+-type diffusion layers 18 and their peripheral structures of modifications of the dRAM of the first embodiment, respectively. The same reference numerals used in FIG. 1 denote the same parts in FIGS. 3 and 4, and a detailed description thereof will be omitted.

In FIG. 3, a polycrystalline silicon layer 30 serving as the gate electrode is etched to extend at the intermediate portion of the top surface of an n+-type diffusion layer 18 formed on and in a silicon substrate 10. In other words, the polycrystalline silicon layer 30 partially overlaps the n+-type diffusion layer 18 so as to partially expose the top surface of the n+-type diffusion layer 18. An electrically insulating layer 32 is formed on the obtained structure. The insulating layer 32 is etched by a known technique to have a contact hole 34 which is formed on an exposed surface 18a of the n+-type diffusion layer 18. A metal layer 36 such as an Al layer serving as a wiring pattern for memory cells of the dRAM is deposited on part of the insulating layer 32 so as to fill the contact hole 34. The Al metal layer 36 directly contacts, through the contact hole 34 in the insulating layer 32, the exposed surface 18a of the n+-type diffusion layer 18 formed on the silicon substrate 10.

FIG. 4 is a partial sectional view of a portion of the dRAM which is not illustrated in FIG. 1 and which extends to the left of the substrate region S which has the n+-type diffusion layer 18 therein shown in FIG. 1. Referring to FIG. 4, the field insulating layers 12 are designated as 12-1, 12-2 and 12-3 for illustrative convenience. An n+-type diffusion layer 40 formed on the surface region S of the silicon substrate 10 between the insulating layers 12-1 and 12-2 extends downward under the insulating layer 12-2 and reaches a surface region S' of the substrate 10 which is sandwiched between the field insulating layers 12-2 and 12-3. The sectional structure of the n+-type diffusion layer 40 extending between the surface regions S and S' through a portion under the insulating layer 12-2 is clearly illustrated in FIG. 4. An insulating layer 42 is formed to cover a thin gate insulating film 14c formed on the surface region S' of the silicon substrate 10. A contact hole 44 is formed in portions of the insulating film 14c and the insulating layer 42 formed thereon. An Al layer 46 is deposited on the insulating layer 44 so as to fill the contact hole 44 with aluminum. The Al layer 46 directly contacts the n+-type diffusion layer 40 through the contact hole 44 formed in the insulating layer 42 and the thin gate insulating film 14c. It should be noted that one more additional masking process must be performed before the gate electrode layer 16' is formed so as to prepare the above-described structure. In addition to this, ion implantation or diffusion must be performed to form a portion of the n+-type diffusion layer 40 which is formed under the layer 12-2 and which is formed in the surface region S'.

Figure 5A:
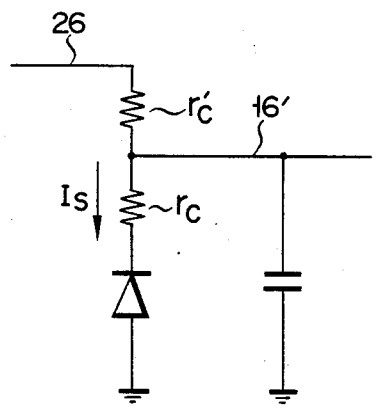
FIGS. 5A and 5B are respectively circuit diagrams of equivalent circuits of the main parts of the embodiment shown in FIG. 1 and each of the modifications shown in FIGS. 3 and 4 so as to explain prevention of dielectric breakdown of the memory cell capacitor against a surge voltage component applied from the power source line.
Figure 5B:
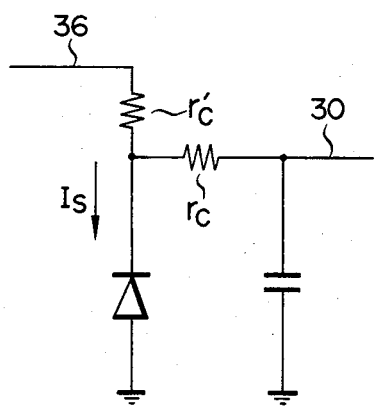

According to the modifications shown in FIGS. 3 and 4, in addition to the above advantages, the gate insulating film 14 of the capacitor element is protected against dielectric breakdown caused by the surge voltage component applied from an external source through the power source line in accordance with the following reason. Referring to FIG. 1E, the n+-type diffusion layer 18 ohmically contacts the gate electrode layer 16' and the gate electrode layer 16' ohmically contacts the Al layer 26, so that contact resistances are present therebetween. If the contact resistance between the N+ layer 18 and the gate electrode layer 16' and the contact resistance between the gate electrode layer 16' and the Al layer 26 are given as $r_c$ and $r_c'$, respectively, the equivalent circuit of the main part of the first embodiment in FIG. 1 is shown in FIG. 5A. Therefore, when a surge voltage component is applied from an external source through the power source line and a surge current $I_s$ flows through the p-n junction diode, the part of the surge voltage divided by $r_c'$ $r_c$ is directly applied to the memory capacitor through the gate electrode layer 16'. Thus, the memory capacitor is not protected against this surge voltage component at all. However, according to the modification shown in FIG. 3 (as well as the modification shown in FIG. 4), the Al layer 36 is directly connected to the p-n junction diode. Therefore, the equivalent circuit of the structure of the modification is shown in FIG. 5B wherein the contact resistance $r_c$ is taken out from the current path through which a surge current $I_s$ flows. Therefore the surge voltage is sufficiently reduced by the resistance $r_c'$ when the surge current $I_s$ flows. The upper limit of the voltage applied to the gate electrode 30 may not exceed the reverse dielectric withstand voltage of the p-n junction arrangement (or diode) of the p-type silicon substrate 10 and the n+-type diffusion layer 18. Therefore, when the reverse dielectric withstand voltage at the p-n junction is set lower than that of the gate insulating film 14, the gate insulating film 14 of the memory capacitor is not damaged preventing a dielectric breakdown by the external surge voltage applied to the Al layer 36 through the power source line. According to the present invention which has an insulating layer with a unique structure, the dielectric breakdown of the insulating film of the memory cell is further decreased, thereby improving the element reliability.

Figure 6:
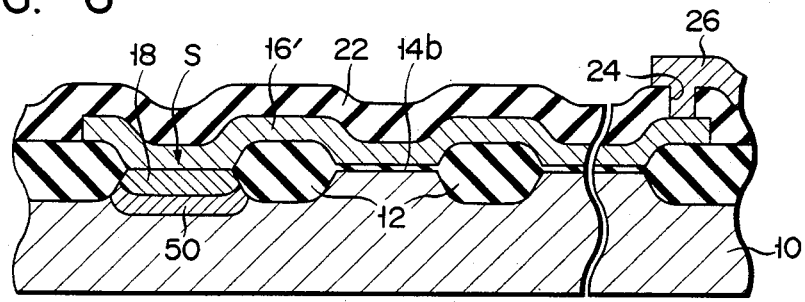
FIG. 6 is a partial sectional view showing the main part of a dRAM according to a second embodiment of the present invention.

FIG. 6 is a partial sectional view showing the main part of a dRAM according to a second embodiment of the present invention. A p+-type diffusion layer 50 is additionally formed in a portion of a p-type silicon substrate 10 where an n+-type diffusion layer 18 is formed in a surface region S of the silicon substrate 10. The diffusion layer 50 has a conductivity type opposite to that of the n+-type diffusion layer 18 and has the same conductivity type as that of the silicon substrate 10. In other words, the junction region between the n+-type diffusion layer 18 and the p-type silicon substrate 10 is constituted by a high-impurity p+-type diffusion layer.

When forming the p+-type diffusion layer 50, among gate insulating films 14 (each having a thickness of about 100 Å) formed together with field insulating layers 12, a gate insulating film (corresponding to the film 14a in FIG. 1) located in the surface region S is removed. A p-type impurity such as boron (B) is ion-implanted in the exposed portion of the p-type silicon substrate 10 which corresponds to the surface region S at a dose of $1 \times 10^{16}$ cm$^{-2}$ and at an acceleration voltage of 50 keV. As a result, a high-impurity p-type layer (corresponding to the diffusion layer 50 shown in FIG. 6) is formed in the p-type silicon substrate 10. A polycrystalline silicon layer having no impurity is then deposited to cover the entire surface of the obtained structure to a thickness of 3,000 Å. An impurity such as arsenic (As) is ion-implanted in the polycrystalline silicon layer at a dose of $5 \times 10^{15}$ cm$^{-2}$ and at an acceleration voltage of 50 keV. The arsenic-doped structure is annealed in an atmosphere at a temperature of 1,000° C. for about 10 minutes. Annealing is performed to activate the doped impurity. If an impurity-doped polycrystalline silicon layer is deposited, annealing need not be performed. Alternatively, immediately after boron ions are implanted, annealing may be performed. It is found that annealing need not be performed to guarantee prevention of dielectric breakdown of the insulating film. If annealing is not performed, a high reverse leakage current flows through the p-n junction, so that the polycrystalline silicon electrode 15 may not be charged. From this viewpoint, annealing may be omitted. The bilayer structure having the diffusion layers 18 and 50 shown in FIG. 6 is basically formed in the silicon substrate 10. Other manufacturing steps of this embodiment are the same as those of the first embodiment.

According to the second embodiment shown in FIG. 6, the gate electrode layer 16' of polycrystalline silicon directly contacts the n+-type diffusion layer 18, and the p-type silicon substrate 10 is connected to the n+-type diffusion layer 18 through the p+-type diffusion layer 50. Therefore, the reverse dielectric withstand voltage level of the p-n junction arrangement corresponding to the diode can be decreased to about 3 to 4 V. Therefore, when the reverse bias voltage is applied to the p-n junction due to abnormal charging and reaches about 3 to 4 V, the p-n junction is subjected to avalanche breakdown, whereby the abnormal charge further flows to the silicon substrate 10 in the polycrystalline silicon layer of the gate electrode layer 16. In this case, since the dielectric withstand voltage of the thin oxide (insulating) film 14 having a thickness of about 100 Å is about 10 V, the reverse dielectric withstand voltage of about 3 to 4 V at the p-n junction is a sufficient value for preventing electrostatic dielectric breakdown of the memory cell capacity. During the operation of the dRAM having the above structure, when the gate electrode layer 16' is negatively charged with the abnormal charge with respect to the silicon substrate 10, the p-n junction is forward biased. Therefore, the remaining abnormal charge is readily discharged to the silicon substrate 10. The prevention of the electrostatic dielectric breakdown of the memory cell capacitor can be effectively improved.

Figure 7:
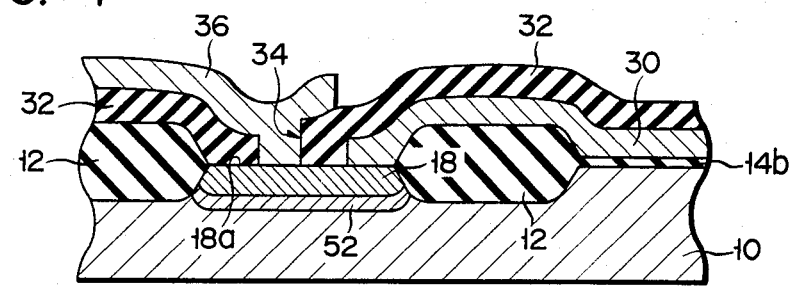
FIGS. 7 to 9 are respectively partial sectional views of main parts of modifications of the dRAM shown in FIG. 6.
Figure 8:
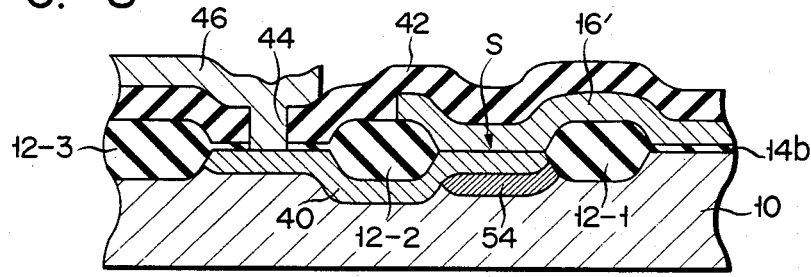

FIGS. 7 and 8 show modifications of the second embodiment shown in FIG. 6. These modifications are obtained by adding the structural feature (i.e., a p+-type layer) of the second embodiment to the modifications shown in FIGS. 3 and 4, respectively. Therefore, both the effect obtained with reference to the modifications shown in FIGS. 3 and 4 and the effect obtained by the second embodiment shown in FIG. 6 are obtained by the modifications shown in FIGS. 7 and 8. More specifically, in the modification shown in FIG. 7 (or FIG. 8), a p+-type layer 52 (54) is formed in the region of a p-type silicon substrate 10 under an n+-type diffusion layer 18 (40). Referring to FIG. 7, an Al layer 36 is connected to a p-type silicon substrate 10 through an n+-type diffusion layer 18 and a p+-type layer 52. On the other hand, as shown in FIG. 8, an n+-type diffusion layer 40 connected to an Al layer 46 is connected to a p-type silicon substrate 10 through at least part of a p+-type layer 54. Therefore, the voltage level applied to the gate electrode layer 30 or 16' cannot exceed the reduced reverse dielectric withstand voltage at the p-n junction. Therefore, the memory cell is further protected against dielectric breakdown caused by the surge voltage applied from the external source through the power source line and the Al layer 36 or 46.

Figure 9:
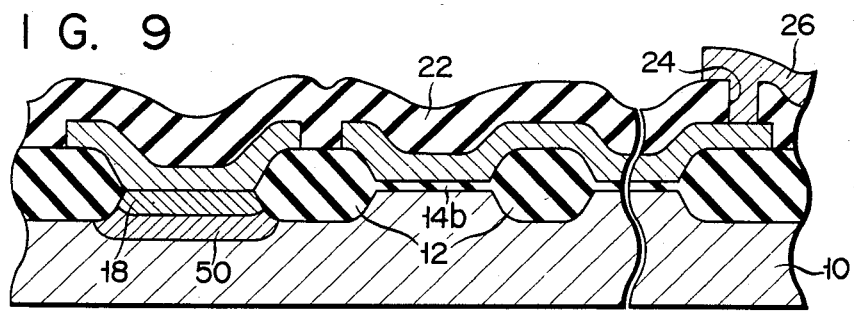

In addition to this, in order to only prevent electrostatic dielectric breakdown of the polycrystalline silicon layer at the time of etching, after the polycrystalline silicon layer is patterned, the part of the polycrystalline silicon layer directly connected to the n+-type diffusion layer 18 may be cut from any other portion thereof which constitutes the memory cell capacitor, as shown in FIG. 9. For this purpose, isotropic plasma etching is preferred using an etching solution which has a small charging effect.

Figure 10A:
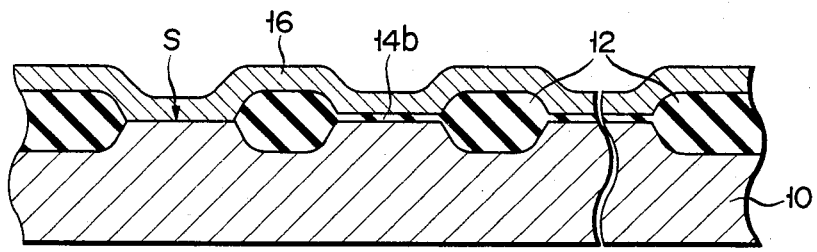
FIGS. 10A to 10C illustrate, in schematic cross sections, some of the major steps in the formation of a dRAM in accordance with a third embodiment of the invention.
Figure 10B:
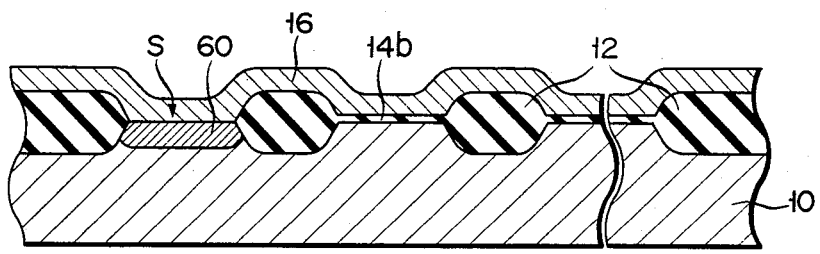

A third embodiment of the present invention will be described with reference to FIGS. 10A to 10C. Among thin gate insulating films 14 formed on a p-type silicon substrate 10 together with field insulating layers 12 in order to prepare a dRAM, a thin film located in a surface region S of the p-type silicon substrate 10 is removed, thereby obtaining a structure shown in FIG. 10A. A p-type impurity such as boron (B) is ion-implanted in the polycrystalline silicon layer which then serves as a gate electrode layer 16 at a dose of $5 \times 10^{15}$ cm$^{-2}$ and at an acceleration voltage of 60 keV. This impurity has the same conductivity type as that of the silicon substrate 10. The obtained structure is annealed at a temperature of 1,000° C. for about 20 minutes. The sheet resistance of the gate electrode layer 16 is decreased to 50 to 80Ω/□. In this condition boron ions are diffused in the surface region S of the silicon substrate 10 which is exposed by removal of the gate insulating film, so that a p+-type diffusion layer 60 is formed as shown in FIG. 10B.

Substantially, the same process as that in FIG. 1D with reference to the first embodiment is performed. A photoresist pattern (corresponding to the pattern 20 in FIG. 1D) is formed on the gate electrode layer 16, and the gate electrode layer 16 is selectively etched using the photoresist pattern as a mask. In this case, it is preferred that the RIE method is used using a gas containing chlorine in a form such as Cl$_2$ or C$_x$F$_y$Cl$_2$ in the same manner as in FIG. 1D. Subsequently, the photoresist pattern is removed. As shown in FIG. 10C, an insulating layer 22 and an Al layer 26 as a wiring pattern are formed in the same manner as in FIG. 1E According to the third embodiment, a gate electrode layer 16' is connected to the p-type silicon substrate 10 through the p+-type diffusion layer 60. The gate electrode layer 16' ohmically contacts the silicon substrate 10 through the p+-type diffusion layer 60 having the same conductivity type as that of the silicon substrate 10. Therefore, the gate electrode layer 16' has substantially the same potential as that of the silicon substrate 10. Even if the gate electrode layer of polycrystalline silicon is charged negatively or positively with respect to the silicon substrate at the time of etching by the externally applied charge, the charge can be easily removed from the gate electrode layer to the silicon substrate. Therefore, the dielectric breakdown (caused by abnormal charging in the manufacturing process of the dRAM) of the thin insulating film 14 of the memory cell capacitor can be effectively prevented.

The capacitor gate electrode of the dRAM thus prepared has the same potential (i.e., ground potential) as that of the silicon substrate. When a negative bias voltage is applied to the silicon substrate, or when the power source voltage $V_{DD}$ (e.g., +5 V) is applied to the capacitor gate electrode, the capacitor gate electrode cannot be used without modification. In order to solve this problem, modifications of the present invention will be described hereinafter.

Figure 10C:
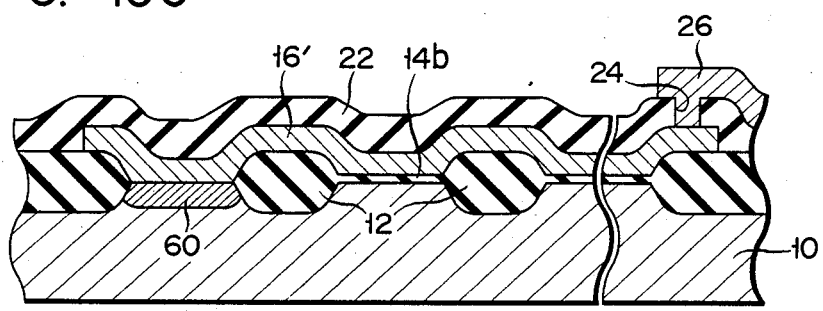
Figure 11:
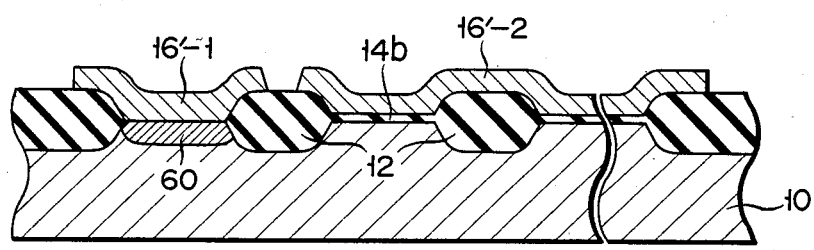
FIGS. 11 to 14 are respectively partial sectional views showing the main parts of modifications of the dRAM shown in FIG. 10.

According to the modification shown in FIG. 11, the polycrystalline silicon layer is selectively etched to be divided into layer components 16'-1 and 16'-2 before the layers 22 and 26 are deposited in the process with reference to FIG. 10C. The layer component 16'-1 of the polycrystalline silicon layer which is directly connected to the p+-type diffusion layer 60 formed in the substrate 10 is electrically insulated or separated from the layer component 16'-2. It should be noted that the polycrystalline silicon layer is etched using an etching solution or by isotropic dry etching each of which has a small charging effect. According to the obtained structure shown in FIG. 11, electrostatic dielectric breakdown of the memory cell capacitor which is caused by the abnormal charge of a positive or negative polarity during the manufacturing process is effectively prevented. Thereafter, the layer component 16'-2 which serves as the gate electrode is electrically separated from the silicon substrate 10. Therefore, the above manufacturing step can be applied to the conventional memory cell structure. In other words, although dielectric breakdown of the insulating film after the manufacture of the dRAM is not effectively prevented, the dielectric breakdown of the insulating film during the manufacturing process of the memory cell can be effectively prevented. In this modification, the above polycrystalline silicon layer-etching process may be performed at the final step included in the manufacturing process of the dRAM, whereby the electrostatic dielectric breakdown of the memory cell capacitor can be more effectively prevented during the whole manufacturing process.

Figure 12:
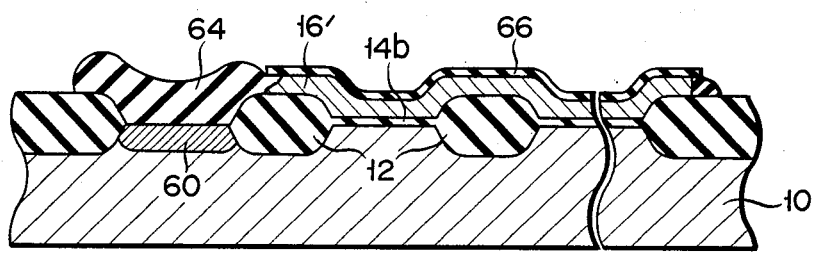
Figure 13:
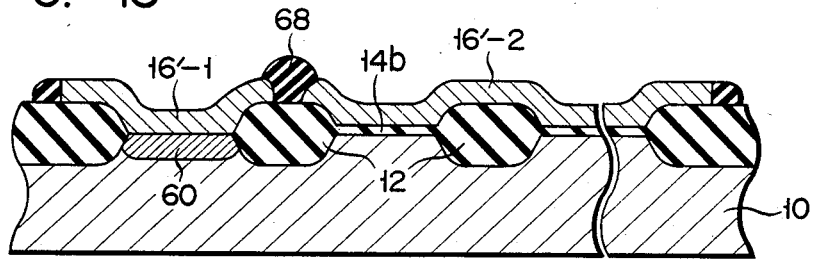

According to the structures shown in FIGS. 12 and 13, modifications are illustrated wherein the above-mentioned electric separation of the polycrystalline silicon gate electrode layer is greatly improved. Referring to FIG. 12, part of the gate electrode layer which directly contacts the $p^+$-type diffusion layer 60 is oxidized to form an oxide layer 64. The remaining electrode layer component 16' and the $p^+$-type diffusion layer 60 are effectively and electrically insulated by the oxide layer 64. In the above local oxidation step, selective oxidation is performed using a silicon nitride film 66 formed on the layer 16'. Referring to FIG. 13, a region of the polycrystalline silicon gate electrode layer which is subjected to oxidation is further narrowed. The layer component 16'-1 directly connected to the $p^+$-type diffusion layer 60 is effectively and electrically insulated by a silicon oxide layer 68 from the layer component 16'-2.

Figure 14:
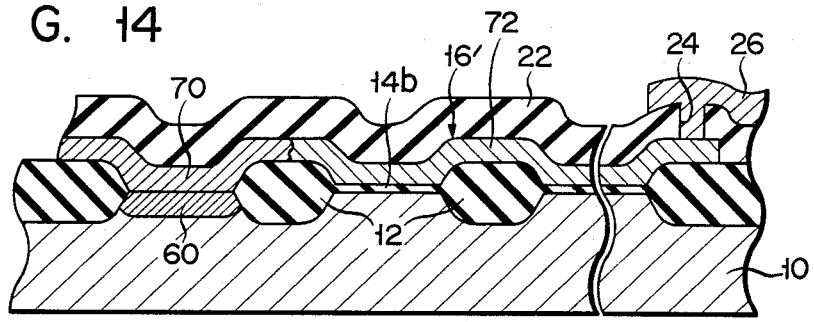

According to the structure shown in FIG. 14, a modification is illustrated wherein a p-n junction is formed in the polycrystalline silicon gate electrode layer 16'. An n-type impurity such as arsenic (As) is ion-implanted in a portion 70 which is directly connected to a $p^+$-type diffusion layer 60 in the p-type silicon substrate 10. The portion 70 is changed to have a n-type conductivity type, while the other layer portion 72 is left to have the p-type. Thus, the region of the layer 16' which serves as a prospective memory cell capacitor region is separated from the substrate 10 by the p-n junction diode. Furthermore, since the p-n junction is formed, the reverse dielectric withstand voltage level of the diode can be decreased compared with the case (FIG. 1) in which the p-n junction is formed in the silicon substrate 10.

Although the present invention has been shown and described with respect to particular embodiments, various changes and modifications which are obvious to a person skilled in the art to which the invention pertains are deemed to lie within the spirit and scope of the invention.

For example, the $n^+$-type diffusion layer need not be formed before the polycrystalline silicon layer is etched. The $n^+$-type diffusion layer may be formed after the polycrystalline silicon layer is etched. In the above embodiments, the impurity is doped in the atmosphere of $POCl_3$. However, ion implantation may be performed or an impurity-doped polycrystalline silicon layer may also be used. In the above embodiments, each memory cell comprises one transistor element and one capacitor element. However, the arrangement of the memory cell need not be limited to the above arrangement. The present invention can be, of course, applied to various memory cells which use MOS capacitors. The techniques used in the manufacturing process of the present invention may be changed and modified within the spirit and scope of the present invention.

What is claimed is:

1. A method of manufacturing a dynamic semiconductor memory device having a plurality of memory cells each of which has a capacitor element, said method comprising the steps of:

forming an electrically insulative film on a semiconductive substrate of a first conductivity type, said electrically insulative film being used for a dielectric body of said capacitor element of each of said memory cells and having an opening exposing a portion of the surface of said substrate;

forming an electrically conductive layer on said insulative film and on said exposed portion of the surface of said substrate, said conductive layer corresponding to a gate electrode; and performing a reactive ion etching step on said conductive layer while maintaining an electric contact between said conductive layer and said substrate through said opening, whereby charges produced by the reactive ion etching and stored in said insulative film are removed to said substrate via said conductive layer, thereby preventing an increase in an electric field within said insulative film and preventing damage to said insulative film due to an electrostatic dielectric breakdown.

2. The method according to claim 1, further comprising the step of forming a semiconductor layer on said exposed portion of said surface of said substrate, said semiconductor layer having a second conductivity type opposite to the first conductivity type of said substrate and serving to connect said conductive layer and said substrate.

3. The method according to claim 1, further comprising the step of forming a semiconductor layer on said exposed portion of said surface of said substrate, said semiconductor layer having the first conductivity type which is the same as the first conductivity type of said substrate and serving to connect said conductive layer and said substrate, whereby the charges which have any one of positive and negative polarities and which are stored in said insulative film are discharged to said substrate through said semiconductor layer irrespective of the polarity of the charges.

4. The method according to claim 3, further comprising an insulating step of electrically insulating said conductive layer from said semiconductor layer formed in said substrate, after the charges are discharged from said conductive layer to said substrate.

5. The method according to claim 4, wherein the insulating step includes the step of electrically insulating a first layer component of said conductive layer which contacts said semiconductor layer from a second layer component of said conductive layer which contacts said insulative film.

6. The method according to claim 4, wherein the insulating step includes the step of oxidizing a first layer component of said conductive layer of a polycrystalline semiconductor material so as to change the polycrystalline semiconductor material to an electrical insulating material, said first layer component contacting said semiconductor layer, whereby a second layer component of said conductive layer which contacts said insulative film is electrically insulated from said semiconductor layer.

7. The method according to claim 5, wherein said insulating step includes the step of oxidizing a portion of said conductive layer made of a polycrystalline semiconductor material so as to change the polycrystalline semiconductor material to an electrical insulating material, said portion being sandwiched between said first and second layer components.

8. The method according to claim 1, further comprising, after said reactive ion etching step, a step of cutting the electric contact between said conductive layer and said substrate through said opening to form a common gate electrode for said capacitor elements of said memory cells.

9. The method according to claim 8, wherein said step of cutting the electric contact between said conductive layer and said substrate comprises a step of etching said conductive layer and physically separating that portion of said surface of said substrate from other portions which constitute said capacitors of said memory cells, said physically separation etching being performed by an etching step which has a smaller charge storing effect than said reactive ion etching.

10. The method according to claim 9, wherein said step of cutting the electric contact between said conductive layer and said substrate comprises a liquid etching step.

11. The method according to claim 9, wherein said step of cutting the electric contact between said conductive layer and said substrate comprises an isotropic plasma etching step.

12. The method according to claim 8, wherein:
a polycrystalline silicon layer is formed on said insulative layer as said electrical conductive layer; and
said step of cutting the electric contact between said conductive layer and said substrate comprises a step of partially oxidizing said polycrystalline silicon layer to define an oxide layer portion which is in direct contact with said exposed portion of said surface of said substrate.

13. A dynamic semiconductor memory device produced according to the method of claim 1.

14. A dynamic semiconductor memory device produced according to the method of claim 8.

15. A dynamic semiconductor memory device produced according to the method of claim 9.

16. A dynamic semiconductor memory device produced according to the method of claim 10.

17. A dynamic semiconductor memory device produced according to the method of claim 11.

18. A dynamic semiconductor memory device produced according to the method of claim 12.

19. A dynamic semiconductor memory device produced according to the method of claim 2.

20. A dynamic semiconductor memory device produced according to the method of claim 3.

21. A dynamic semiconductor memory device produced according to the method of claim 4.

22. A dynamic semiconductor memory device produced according to the method of claim 5.

23. A dynamic semiconductor memory device produced according to the method of claim 6.

24. A dynamic semiconductor memory device produced according to the method of claim 7.

* * * * *